United States Patent [19]
Kato et al.

[11] 4,396,890
[45] Aug. 2, 1983

[54] VARIABLE GAIN AMPLIFIER

[75] Inventors: Kazuo Kato, Ibaraki; Takao Sasayama; Takashi Sase, both of Hitachi, all of Japan

[73] Assignee: Hitachi, Ltd., Tokyo, Japan

[21] Appl. No.: 146,273

[22] Filed: May 5, 1980

[30] Foreign Application Priority Data

May 9, 1979 [JP] Japan ............... 54-55762

[51] Int. Cl.³ .................................. H03F 1/34
[52] U.S. Cl. ..................... 330/86; 330/107; 330/282
[58] Field of Search .......... 330/51, 84, 86, 107, 330/144, 254, 282

[56] References Cited
U.S. PATENT DOCUMENTS 3,787,778  1/1974  Carre et al. ............... 330/109
4,066,976  1/1978  Dickopp et al. ........... 330/51

FOREIGN PATENT DOCUMENTS 2352438  5/1976  France ............... 330/282

OTHER PUBLICATIONS

Caves et al., "Sampled Analog Filtering Using Switched Capacitor as Resistor-Equivalents" IEEE Journal of Solid State Circuits, vol. SC-12, No. 6, Dec. 1977.

*Primary Examiner*—James B. Mullins
*Assistant Examiner*—Gene Wan
*Attorney, Agent, or Firm*—Antonelli, Terry & Wands

[57] ABSTRACT

A variable gain amplifier includes an amplifier for amplifying an input signal, a switch controlled with a given duty factor and a smoothing filter connected to the switch. The filter and the switch constitutes a negative feedback loop for the amplifier of which amplification factor is variably controlled by varying the duty factor of the switch.

30 Claims, 16 Drawing Figures

VARIABLE GAIN AMPLIFIER

BACKGROUND OF THE INVENTION

1. FIELD OF THE INVENTION

The present invention relates to a negative feedback amplifier and more particularly concerns an amplifier having a variable gain (hereinafter referred to as the variable gain amplifier) which is suited to be implemented in the form of an integrated circuit.

2. DESCRIPTION OF THE PRIOR ART

As the variable gain amplifier which is capable of amplifying a signal voltage with a given amplification factor with high accuracy, there has been hitherto known a negative feedback amplifier which comprises an amplifier provided with a feedback loop including high precision operational resistors. In order to allow the gain of the negative feedback amplifier to be varied in a wide range, a voltage divider circuit composed of a number of high precision resistors has to be provided in the feedback path, involving a complicated and expensive circuit configuration. Further, difficulty is encountered in the attempt to implement the negative feedback amplifier in the form of an integrated circuit. Namely, when the resistors are realized in the integrated circuit, the resistance value of the integrated resistors becomes unstable under the influence of voltage, making it difficult to attain a high precision resistance. Under these circumstances, realization of the negative feedback amplifier which requires high precision resistors has been difficult.

As an attempt to overcome the difficulties described above, there has been proposed a variable gain amplifier, the gain of which is controllable by controlling the dividing ratio of voltage in accordance with the duty cycle or duty ratio of a control pulse signal. A typical example of a variable gain amplifier which is operative on the basis of such a principle is shown in FIG. 1. An input signal to be amplified is supplied from an input signal source 50 to a CR-smoothing circuit composed of a resistor 111 and a capacitor 130 through a switch 150, wherein the output from the smoothing circuit is supplied to an operational amplifier 200. By controlling the on-off operation of the switch 150, it is possible to derive a smoothed d.c. output signal through the buffer amplifier 200 having a high input impedance, which signal is in proportion to the duty cycle $\alpha$ of the pulse voltage signal applied to the smoothing circuit. It will be appreciated that the voltage divider circuit comprising a number of resistors is replaced by the combination of the switch 150 and the smoothing circuit 111, 130.

When the output voltage of the signal source 50 is represented by $V_i$, the output voltage of the amplifier is represented by $V_o$ and the resistance value of the smoothing circuit is represented by R, then the output voltage $V_o$ is determined in the following manner on the assumption that the switch is an ideal one.

$$(V_i - V_o)\alpha T_o \cdot 1/R = V_o(1-\alpha)T_o \cdot 1/R, \text{ Therefore,}$$
$$V_o = V_i\alpha \quad (1)$$

where $T_o$ represents the period of the pulse voltage signal. It is apparent that the output voltage $V_o$ is determined with high accuracy from the applied voltage $V_i$ and the duty cycle or duty factor $\alpha$. In this manner, the circuit which comprises the resistor 111 and the capacitor 130 and serves for voltage division in dependence on the duty factor of the on-off switch 150 makes it possible to control the gain of the amplifier 200 with an extremely high accuracy. However, the variable gain amplifier circuit of the type described above is disadvantageous in that a high speed response can not be attained. For example, in order to attain a gain of the amplifier with precision in the order of 0.1% by reducing ripple components contained in the output signal from the smoothing circuit, the time constant $\tau$ of the CR-smoothing circuit must be approximately equal to 500 $T_o$. Further, the time constant $\tau$ must be approximately equal to 3500 $T_o$ when a time $7\tau$ is required for settling the output voltage responsive to a steeply changing input voltage. Thus, the response of the amplifier is made very slow with respect to the input signal. To avoid such inconveniences, it has also been proposed to adopt a sample and hold technique to effect the feedback control at a sampling period aproximately equal to the time constant of the CR-smoothing circuit, thereby to attain the rapid response by settling the input signal for every several samplings. However, unless the CR-time constant of the smoothing circuit coincides with the sampling period, the number of the settling cycles as required will be increased. Further, a problem lies in respect of the amplification and the complicated circuit configuration.

SUMMARY OF THE INVENTION

An object of the invention is to provide a variable gain amplifier having a simple circuit arrangement which provides a gain control with high accuracy and is capable of responding at high speed.

The invention starts from the fact that the delay time involved in the negative feedback circuit can be reduced in inverse proportion to the loop gain, and proposes that the feedback loop be constituted by a switch adapted to be controlled in on-off operation thereof with a given duty cycle and a smoothing filter circuit connected to the switch.

DETAILED DESCRIPTION OF THE PREFERRED EMBODIMENTS

Figure 1:
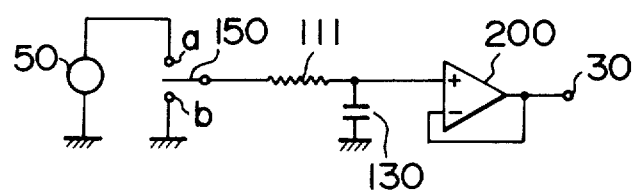
FIG. 1 is a circuit diagram showing a typical one of hitherto known dividers with a variable dividing ratio.

Now, the invention will be described in detail by referring to the accompanying drawings, in which the same reference numerals denote like parts or components.

Figure 2:
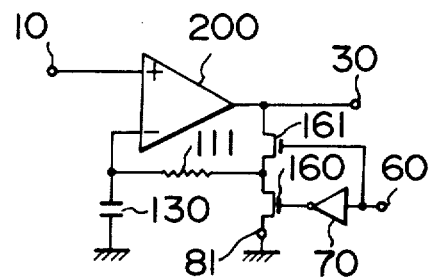
FIG. 2 is a circuit diagram showing a first exemplary embodiment of the variable gain amplifier according to the present invention.

Referring to FIG. 2 which shows a variable gain amplifier according to a first embodiment of the invention, a signal input terminal 10 is connected to a plus (+) input terminal of an operational amplifier 200 having a high gain and a high input impedance. Connected to a minus (−) input terminal of the operational amplifier 200 are one end of a resistor 111 and one end of a capacitor 130, respectively, the other end of the capacitor 130 is grounded to earth, while the other end of the resistor 111 is connected to a drain electrode or terminal of a switch element 161 which is preferably constituted by a FET (Field Effect Transistor). The FET switch 161 has a source electrode connected to an output terminal of the operational amplifier. The drain electrode of the FET switch 161 is connected to a source electrode of another switch element 160 which is also preferably constituted by a FET. The FET switch 160 has a drain electrode connected to a terminal 81 which is at a predetermined constant voltage level applied externally (in the case of the embodiment being described, this terminal 81 is assumed to be grounded). The FET switch 161 has a gate connected to a control signal input terminal 60, while the FET switch 160 has a gate electrode connected to the input terminal 60 for an on-off control signal through an inverter gate circuit 70. The output terminal of the operational amplifier 200 is connected to an output terminal 30 of the variable gain amplifier.

The resistor 111 and the capacitor 130 cooperates to constitute a CR-smoothing filter. An input voltage signal to be amplified is applied to the input terminal 10. A pulse signal for controlling the turn-on and turn-off operations of the FET switches 160 and 161 are applied to the terminal 60. The output voltage signal of the variable gain amplifier can be derived from the output terminal 30. The period of the control pulse signal applied to the control terminal 60 is set at a sufficiently long time so that the switching speed of the FET switches can be neglected from consideration. Further, the time constant determined by the values of the resistor 111 and the capacitor 130 is selected sufficiently large as compared with the period of the control pulse signal.

Figure 3:
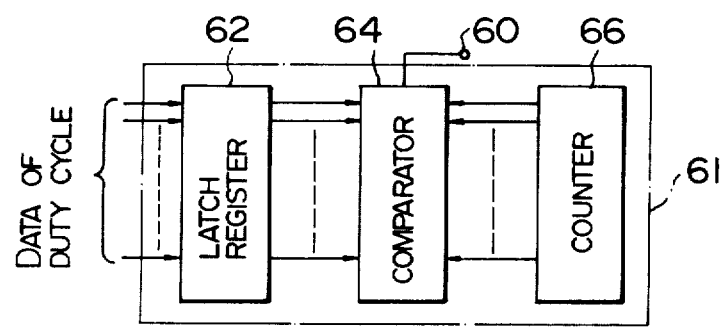
FIG. 3 is a block diagram showing an example of an on-off control signal generator.

Referring to FIG. 3 which shows in a block diagram an exemplary embodiment of a generator 61 for producing the on-off control signal (i.e. pulse signal), the control pulse generator 61 comprises a latch register 62 for holding therein binary data set externally and representing the duty cycle or on-duty ratio of the on-off control signal, a counter 66 for counting a clock pulse signal of a predetermined repetition frequency, and a comparator 64 for comparing the count value in the counter 66 with the data held in the latch register 62. When the contents of the counter 66 and the data set at the latch register 62 coincide with each other, the output signal of the comparator 64 will undergo a change in the signal level, e.g. change from a high level "H" to a low level "L". Every time when overflow occurs in the count value, the counter 66 is automatically reset with the comparator 64 also concurrently being reset, as the result of which the output from the comparator 64 will change from the level "L" to "H". The output pulse signal from the comparator 64 is available at an output terminal 60. The period of the pulse signal appearing at the terminal 60 coincides with the resetting cycle of the counter 66, while the duty cycle of the output pulse signal can be controlled by correspondingly varying the data loaded in the latch register 62. For the pulse generator of the type described above, there is commercially available a device "Programmable Timer Module MC 1840" from Motorola Company.

When the pulse signal applied to the terminal 60 (FIG. 2) is at the high level or "H", the FET switch 161 is turned on, whereby the capacitor 130 is charged with the output from the operational amplifier 200 at a rate corresponding to a time constant determined by the values of the capacitor 130 and the resistor 111. When the control pulse is at the low level or "L", the FET switch 161 is turned off to thereby allow the capacitor 130 to be discharged through the resistor 111 and the FET 160.

When the input voltage applied to the input terminal 10 is represented by Vi, the output voltage available at the output terminal 30 is represented by Vo, the duty factor or on-duty ratio of the FET switch 161 is represented by α, the value of the resistor 111 is represented by R, the value of the capacitor 130 is represented by C, the conducting resistances of the FET switches 161 and 160 are represented by $r_{on1}$ and $r_{on2}$, respectively, where $(r_{on1} - r_{on2}) << R$, and the non-inverted input voltage to the operational amplifier 200 are represented by $e_1$ and $e_2$, respectively, the following expressions apply in the balanced state of the circuit shown in FIG. 2. Namely, $$e_1 = Vi, e_1 = e_2$$

$$\frac{(Vo - e_2) \alpha To}{C(R + r_{on1})} = \frac{e_2(1 - \alpha) To}{C(R + r_{on2})} \quad (2)$$

$$\therefore Vo = Vi/\alpha \quad (3)$$

Figure 4:
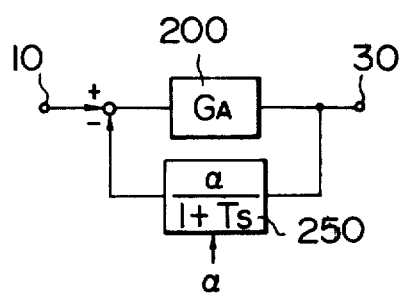
FIG. 4 shows in a block diagram the variable gain amplifier shown in FIG. 2.

A block diagram of the circuit in question can be depicted in a manner shown in FIG. 4 in which $G_A$ represents the gain of the operational amplifier 200, Ts represents a first order delay time constant, and 250 denotes a first order delay element constituted by the capacitor 130 and the resistor 111.

The transfer function G(s) of the circuit shown in the block diagram of FIG. 4 can be expressed as follows:

$$G(s) = \frac{G_A}{1 + G_A \frac{\alpha}{1 + Ts}} \approx \frac{\frac{1}{\alpha}(1 + Ts)}{1 + \frac{Ts}{G_A \alpha}} \quad (4)$$

As will be appreciated, the first order delay time constant Ts corresponds to $1/G_A \cdot \alpha$ where $G_A \cdot \alpha$ is a loop gain and can be decreased significantly because of an extremely large gain $G_A$ of the operational amplifier 200. In reality, the time constant in question can be realized in a range of several hundredths to several ten hundredths. In this manner, in the case of the variable gain amplifier according to the first embodiment of the invention being now described, the gain can be varied with a high accuracy in an enlarged range in dependence on the duty factor $\alpha$ of the FET switch 161. Further, the amplifier exhibits a high speed response.

For controlling the gain of the amplifier in dependence on the duty factor of the FET switch, two different gains can be obtained by using one and the same pulse generator 61. For example, when the on-duty ratio or duty factor of the FET switch 160 shown in FIG. 2 is represented by $\alpha$ as defined hereinbefore, the output voltage Vo available at the output terminal 30 (FIG. 2) is given by the following expression:

$$Vo = Vi/(1-\alpha) \quad (5)$$

Figure 5:
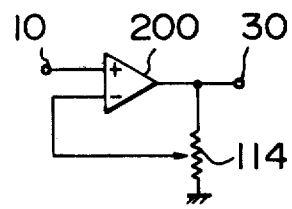
FIG. 5 shows an equivalent circuit of the variable gain amplifier shown in FIG. 2.

FIG. 5 shows an equivalent circuit of the variable gain amplifier shown in FIG. 2. The combination of the CR-smoothing circuitry (111, 130) and the switch circuit composed of the FET's (160, 161) and the inverter 70 is equivalent to a variable resistor 114, wherein the control of the pulse signal applied to the control terminal 60 in respect of the on-duty ratio or duty cycle corresponds to the control of the resistance value of the variable resistor 114.

Figure 6:
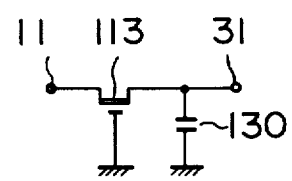
FIG. 6 shows a version of a smoothing filter circuit.

Since the filter or the CR-smoothing circuit need not have a high sensitivity or a rapid response to the change in the gain of the variable gain amplifier according to the illustrated embodiment of the invention, various circuits inclusive of non-linear elements can be made use of. By way of example, a polysilicon resistor, a diffusion resistor or a depletion type field effect transistor or FET may be employed. In FIG. 6, there is shown a smoothing filter circuit in which a depletion type FET 113 is used. In this case, a gate of the FET 113 is biased by a predetermined constant voltage, e.g. the ground potential. Further, the capacitor may be implemented in a MOS structure having an insulation in a form of an oxide film so that the whole variable gain amplifier circuit can be realized in an integrated circuit.

When the filter circuit shown in FIG. 6 is to be employed, a source terminal 11 of the FET 113 may be connected to a junction between the FET switches 160 and 161 shown in FIG. 2, while one end 31 of the capacitor 130 is connected to the inverted input terminal of the operational amplifier 200.

Figure 7:
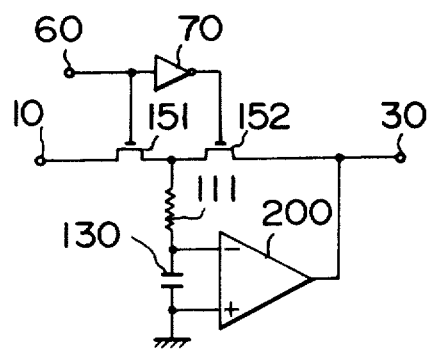
FIG. 7 is a circuit diagram showing a second exemplary embodiment of the variable gain amplifier according to the invention.

FIG. 7 shows a second embodiment of the invention which differs from the variable gain amplifier according to the first embodiment of the invention primarily in that the operational amplifier is implemented as an inverted amplifier.

Referring to FIG. 7, reference numeral 10 denotes an input terminal to which an input voltage signal is applied, 30 denotes an output terminal of the variable gain amplifier and numeral 60 denotes a control terminal to which a control signal is applied. The operational amplifier 200 is connected in an inverted input arrangement having two input terminals between which a capacitor 130 is connected. One end of a resistor 111 is connected to the inverted input terminal of the amplifier 200, while the other end of the resistor 111 is connected to the input terminal 10 through a FET switch 151 on one hand and to the output of the amplifier 200 and hence to the output terminal 30 through a FET switch 152 on the other hand. The FET switches 151 and 152 are connected to each other through an inverter gate circuit 70 so that these switches can be driven in opposite phase relationship to each other in response to the pulse signal applied to the control terminal 60. The time constant of the CR-filter constituted by the resistor 111 and the capacitor 130 is selected sufficiently large as compared with the period To of the pulse signal so that the ripple component of the output signal is suppressed to or below a desired low level. Accordingly, when the input voltage signal Vi is applied to the input terminal 10 with the control pulse signal having the duty cycle $\alpha$ being applied to the control terminal 60, the FET switch 151 is turned on (i.e. conducting) during the high level interval of the control pulse, resulting in that a current flows in the capacitor 130 from the terminal 10 through the resistor 111. On the other hand, during the low level interval of the control pulse, the FET switch 152 in turn is turned on, whereby the current is discharged from the capacitor 130 through the resistor 111 and the FET switch 152. The output voltage Vo appearing at the output terminal 30 is stabilized in the state where the total electric charge quantities corresponding to the current flowing in the capacitor 130 from the terminal 10 and the current flowing out from the capacitor 130 to the output terminal 30, respectively, are equal to each other, and the output signal voltage Vo can be given by the following expression:

$$Vo = -\frac{\alpha}{1-\alpha} \cdot Vi \quad (6)$$

where $\alpha$ represents the duty factor of the FET switch 151 defining the conducting duration ratio thereof. In this case, the input impedance of the variable gain amplifier is given by $R/\alpha$. When $\alpha$ represents the duty factor of the other FET switch 152, the input impedance is given by $R/(1-\alpha)$, and the output signal voltage Vo is given by the following expression:

$$Vo = -\frac{1-\alpha}{\alpha} \cdot Vi \quad (7)$$

Figure 8:
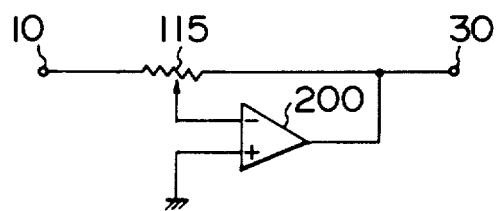
FIG. 8 shows an equivalent circuit of the variable gain amplifier shown in FIG. 7.

FIG. 8 shows an equivalent circuit of the variable gain amplifier shown in FIG. 7. The combination of the switch circuit composed of the inverter gate 70 and the FET switches 151 and 152 and the CR smoothing circuit is equivalent to a variable resistor 115 inserted between the input and the output terminals 10 and 30 and having an adjusting tap connected to the inverted input terminal of the operational amplifier 200.

It will now be understood that the amplifier circuit shown in FIG. 7 is an inverted amplifier which has a gain variable in a wide range with a high accuracy in dependence on the duty cycle of the control pulse signal applied to the control terminal 60. Further, delay in the response of the inverted amplifier is decreased in inverse proportion to the loop gain of the CR-time constant circuit as described hereinbefore in conjunction with FIG. 4. Now, the operational amplifier with differential inputs 200 in FIG. 7 may be replaced by an inverted amplifier with one input.

Figure 9:
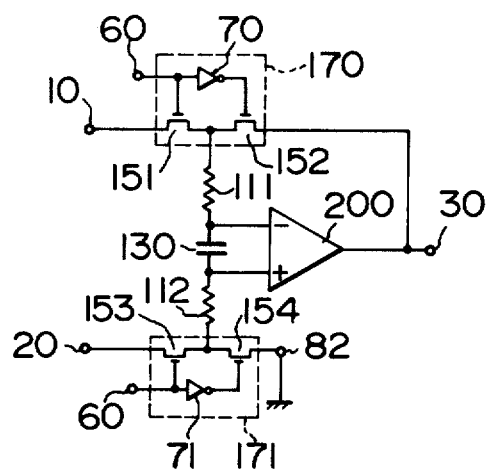
FIG. 9 is a circuit diagram showing a third embodiment of the variable gain amplifier according to the invention.

FIG. 9 shows a third exemplary embodiment of the variable gain amplifier according to the invention which differs from the second embodiment described above in conjunction with FIGS. 7 and 8 in that the input to the operational amplifier is provided by a differential input signal by connecting the non-inverted input of the operational amplifier of the second embodiment to another signal voltage input terminal through a resistor and a switch circuit. More specifically, in addition to the input terminal 10 to which the input signal voltage $V_1$ is applied, there is provided an input terminal 20 to which an input signal voltage $V_2$ is applied, wherein the non-inverted input terminal of the operational amplifier 200 is connected to the second input terminal 20 through a resistor 112 and a switch circuit 171. The switch circuit 171 is of the same circuit configuration as the switch circuit 170 connected to the inverted input terminal of the operational amplifier 200 and includes an inverter 71 and FET switches 153 and 154. The FET 153 has a source electrode connected to the second input terminal 20, a drain electrode connected to a source electrode of the FET 154 and a gate electrode connected to the control signal input terminal 60. On the other hand, the drain electrode of the FET 154 is connected to a terminal 82 applied with a predetermined constant potential from an external potential source (in the case of the illustrated circuit, the terminal 82 is at the ground potential), while a gate electrode of the FET 154 is connected to the control terminal 60 through an inverter 71. The drain electrode of the FET 153 is connected to the non-inverted input terminal of the operational amplifier 200 through a resistor 112. The CR-smoothing circuit is constituted by a differential type filter composed of a series connection of a capacitor 130, a resistor 111 and the resistor 112.

In the switch circuits 170 and 171, a common pulse signal is applied to the respective control terminals 60 from the pulse generator shown in FIG. 3. During the high level interval of the control pulse signal, the FET switches 151 and 153 are turned on (i.e. in the conducting state), whereby the capacitor 130 is charged under a difference voltage $(V_1 - V_2)$ appearing across the input terminals 10 and 20. On the other hand, during the low level interval of the control pulse signal, the FET switches 152 and 154 are turned on, resulting in that the charge stored in the capacitor 130 is discharged toward the output terminal 30. Accordingly, the output voltage at the output terminal 30 is determined under the balanced conditions wherein the charged and discharged charge quantities of the capacitor 130 become equal to each other.

Assuming now that the on-duty factor of the FET's 151 and 153 is 60 the output voltage Vo of the amplifier circuit shown in FIG. 9 is given as follows.

$$V_O = - \frac{\alpha}{1-\alpha} \cdot (V_1 - V_2) \tag{8}$$

In a similar manner, assuming that the on-duty factor of the FET switches 152 and 154 is $\alpha$, the corresponding output voltage Vo is given as follows.

$$V_O = - \frac{1-\alpha}{\alpha} \cdot (V_1 - V_2) \tag{9}$$

The input impedance is given by $R/\alpha$ and $R/(1-\alpha)$ for the operations given by the expressions (7) and (8), respectively, assuming that R represents the combined resistance of the filter circuit. In the circuit arrangement shown in FIG. 9, the resistor of the filter is divided into two resistors 111 and 112, the resistance values of which are not necessarily to be equal to each other, because of the resistors 111 and 112 are connected in series to the capacitor 130 and thus the charging and the discharging conditions are not influenced by the ratio of resistance between the resistors 111 and 112, involving no disturbance to the balanced condition of the input and the output voltages. However, when the resistance values of the resistors 111 and 112 are different remarkably from each other, the input potential to the operational amplifier may transiently undergo a rapid change in response to an A.C. input signal applied across the terminals 10 and 20, as the result of which the balanced condition would transiently be disturbed. Accordingly, in the applications where the transient disturbance to the balanced condition gives rise to a problem, it is desirable that the resistance values of the resistors 111 and 112 should be equal to each other.

Figure 10:
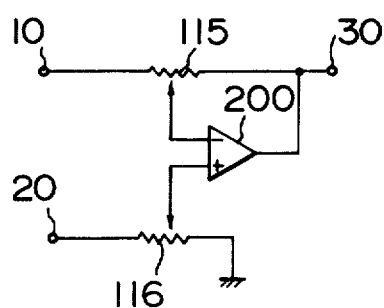
FIG. 10 shows an equivalent circuit of the variable gain amplifier shown in FIG. 9.

FIG. 10 shows an equivalent circuit diagram of the variable gain amplifier shown in FIG. 9. This equivalent circuit differs from the one shown in FIG. 8 in that the non-inverted input terminal of the operational amplifier 200 is connected to an adjustable tap of a variable resistor 116 which has one end connected to the input terminal 20 and the other end grounded. The variable resistor 116 is equivalent to the smoothing filter and the switch circuit 171. The variable resistors 115 and 116 have the same maximum value. The resistance values of the variable resistors 115 and 116 can be controllably changed at the same rate by correspondingly varying the duty cycle of the control pulse signal.

Figure 11:
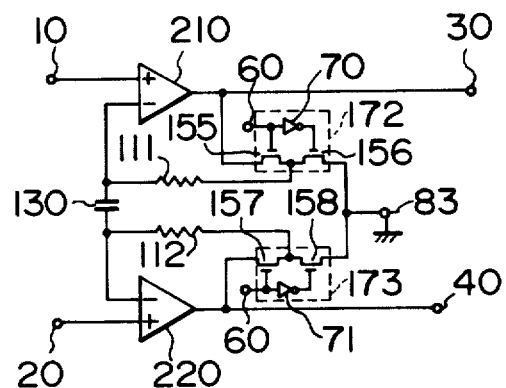
FIG. 11 is a circuit diagram showing a fourth exemplary embodiment of the variable gain amplifier according to the invention.

FIG. 11 shows a circuit arrangement of a fourth exemplary embodiment of the invention, in which the input signal is applied as a differential input with the output signal being derived as a differential output signal. This circuit arrangement can be regarded as a combination of two circuits each implemented according to the first embodiment of the invention described hereinbefore in conjunction with FIG. 2.

Referring to FIG. 11, terminals 10 and 20 serve as the differential input terminals, while terminals 30 and 40 serve as the differential output terminals. The terminals 10 and 20 are connected to the non-inverted input terminals of operational amplifiers 210 and 220, respectively, which have the outputs connected to the terminals 30 and 40, respectively. Further, the outputs of the operational amplifiers 210 and 220 are connected to a CR-smoothing filter composed of resistors 111 and 112 and a capacitor 130 through respective switch circuits 172 and 173. The circuit arrangement of the filter is similar to that of the third embodiment of the invention shown in FIG. 9 and has outputs connected to the inverted input terminals of the operational amplifiers 210 and 220. More specifically, the capacitor 130 of the filter circuit is inserted between the inverted input terminals of the operational amplifier 210 and 220, respectively. The circuit arrangement of the switch circuits 172 and 173 is similar to that of the third embodiment shown in FIG. 9. In the case of the switch circuit 172, the source electrode of the FET 155 is connected to the output terminal of the operational amplifier 210, while the drain electrode of the FET 155 is connected to one end of the resistor 111. The FET switch 156 has a drain electrode 83 which is at a predetermined constant potential applied from an external potential source (in the case of the illustrated embodiment, the drain electrode is grounded). In the switch circuit 173, the FET switch 157 has a source electrode connected to the output of the operational amplifier 220 and a drain electrode connected to one end of the resistor 112. The drain electrode 83 of the FET 158 is grounded.

When an input signal voltage is applied across the input terminals 10 and 20 while the switch circuits 172 and 173 are controlled at a predetermined duty factor, there is produced an output signal voltage across the output terminals 30 and 40 which is determined by the input signal voltage and the duty factor of the switch circuits 172 and 173. When the input voltages to the terminals 10 and 20 are represented by $V_1$ and $V_2$, respectively, while the output voltages appearing at the terminals 30 and 40 are represented by $V_3$ and $V_4$, respectively, then the differential output voltage ($V_3 - V_4$) produced, when the on-duty factor of the FET's 155 and 157 is assumed as $\alpha$, is given by the following expression.

$$V_o = (V_3 - V_4) = \frac{(1-\alpha)}{\alpha}(V_1 - V_2) \qquad (10)$$

In a similar manner, the differential output voltage ($V_3 - V_4$) produced, when the on-duty factor of the FET switches 156 and 158 is assumed as $\alpha$, is given by the following expression:

$$V_o = (V_3 - V_4) = \frac{\alpha}{(1-\alpha)}(V_1 - V_2) \qquad (11)$$

It should be noted that because the switch circuits 172 and 173 are driven by a common pulse signal applied to the terminal 60, the on-off operations of the FET's 155 and 157 as well as the on-off operations of the FET's 156 and 158 are synchronized with each other, respectively.

Since $\alpha$ may take any given value in a control range of $0 < \alpha < 1$, it is also possible to controllably set the gain of a value smaller than 1 (a unit gain) in the case of the circuit configuration shown in FIG. 11, as can be seen from the expressions (10) and (11). By virtue of this advantageous feature, the drawback of the hitherto known differential amplifier applied with a positive phase input through a resistance type voltage divider can be satisfactorily eliminated.

Figure 12:
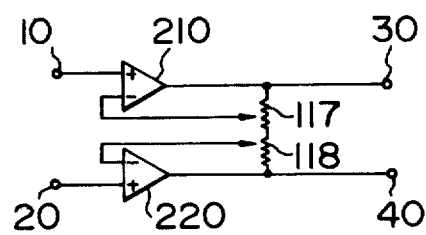
FIG. 12 shows an equivalent circuit of the variable gain amplifier shown in FIG. 11.

FIG. 12 shows an equivalent circuit of the variable gain amplifier shown in FIG. 11. Variable resistors 117 and 118 are connected in series to each other and inserted between the output terminals of the operational amplifiers 210 and 200. Adjusting taps of the variable resistors 117 and 118 are connected to the inverted input terminals of the operational amplifiers 210 and 220, respectively. The variable resistor 117 corresponds to a combination of the filter and the switch circuit 172 shown in FIG. 11, while the resistor 118 is equivalent to the filter and the switch circuit 173. The resistors 117 and 118 have the same maximum value. The resistance values of the resistors 117 and 118 can be controlled at the same rate by controlling the duty cycle of the pulse signal applied to both the switch circuits.

Figure 13:
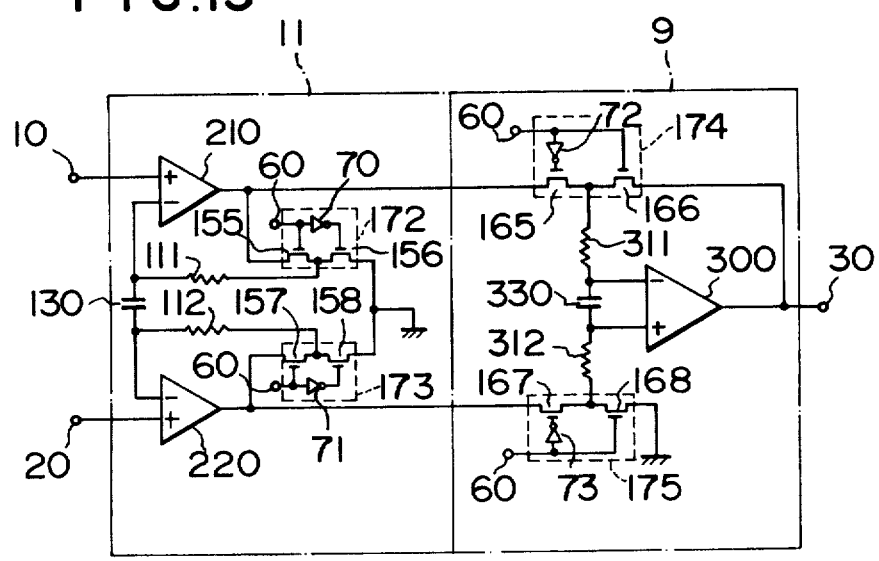
FIG. 13 is a circuit diagram showing an exemplary embodiment of the variable gain amplifier according to the invention.

FIG. 13 shows a fifth exemplary embodiment of the variable gain amplifier according to the invention. The variable gain amplifier is implemented in a circuit arrangement of a differential amplifier of the dynamic bridge type having a high input impedance. More particularly, the variable gain amplifier shown in FIG. 13 includes the circuit shown in FIG. 11 as a pre-amplifier and the amplifier circuit shown in FIG. 9 as a succeeding amplifier stage. Consequently, the characteristics of the amplifier shown in FIG. 13 corresponds to a product of the characteristics of the amplifier circuits shown in FIGS. 11 and 9. Referring to FIG. 13, the circuit portion enclosed by a broken line labelled by 9 corresponds to the variable gain amplifier shown in FIG. 9, and the portion enclosed by a broken line block 11 corresponds to the variable gain amplifier shown in FIG. 11. The switch circuits 172 to 175 are driven by a common pulse signal applied to the respective terminals 60 and thus are controlled in synchronism with one another in respect to the on-off operation thereof. Although the circuit arrangement of the switch circuits 172 and 173 are the same as those of the aforementioned embodiments, it will be understood that the positions of the inverters 72 and 73 of the switch circuits 174 and 175 differ from those of the embodiment described hereinbefore in conjunction with FIG. 9 in that the inverters 72 and 73 are connected between the terminal 60 on one hand and the gates of the FET's 165 and 167 on the other hand, respectively, while the gate electrodes of the FET's 166 and 168 are directly coupled to the terminals 60. The output voltage Vo appearing at the output terminal 30 is given by the following expression:

$$V_o = -\left(\frac{\alpha}{1-\alpha}\right)^2 (V_1 - V_2) \qquad (12)$$

where $V_1$ represents the input voltage to the terminal 10, $V_2$ represents the input voltage to the terminal 20, Vo represents the output voltage at the terminal 30 and $\alpha$ represents the on-duty factor of the FET's 156, 158, 165 and 167 of the switch circuits 172, 173, 174 and 175. On the otherhand, the output voltage Vo produced, when the on-duty factor of the FET's 155, 157, 166 and 168 is assumed as $\alpha$, is given as follows.

$$V_o = -\left(\frac{1-\alpha}{\alpha}\right)^2 (V_1 - V_2) \qquad (13)$$

It will be seen that the switch circuits 174 and 175 may be of the same arrangement as circuits 172 and 173 with the control pulse signal being applied to the terminals 60 after having been inverted. On the other hand, when the gate electrodes of the FET's 165 and 167 are directly connected to the terminal 60 with the gate electrodes of the FET's 166 and 168 being connected to the respective terminals 60 through the inverters 72 and 73 in the same manner as the switch circuits 172 and 173, the FET's 165 and 167 will be turned on when the FET's 155 and 157 are turned on, while FET's 166 and 168 are turned on upon turning-on of the FET's 156 and 158. Then the output signal voltage is given by the following expression:

$$V_o = -\left(\frac{1-\alpha}{\alpha} \cdot \frac{\alpha}{1-\alpha}\right)(V_1 - V_2) = -(V_1 - V_2) \qquad (14)$$

The gain remains always at 1 (one unit) regardless of the value of the duty factor $\alpha$. In this connection, it should be noted that the circuit shown in FIG. 13 can be examined as to whether it operates normally or not by checking whether the gain is equal to 1 (one unit) or not.

Figure 14:
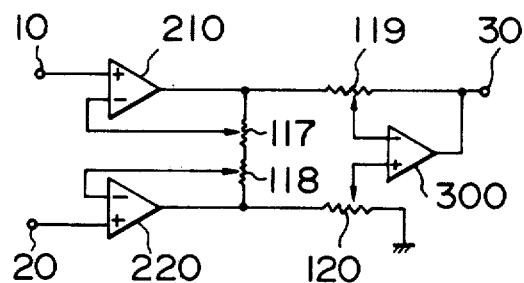
FIG. 14 shows an equivalent circuit of the variable gain amplifier shown in FIG. 13.

FIG. 14 shows an equivalent circuit of the variable gain amplifier shown in FIG. 13. As can be seen from the drawing, the circuit shown in FIG. 14 corresponds to a combination of the circuit shown in FIG. 12 and the circuit shown in FIG. 10, wherein the former is connected as the pre-amplifier and the latter is connected as the succeeding or post-amplifier.

Since the arrangement is made such that the differential output from the pre-amplifier is applied to the post-amplifier as the differential input signal containing no noise, the variable gain amplifier according to the fifth embodiment of the invention functions as an instrumentation amplifier to produce an output signal from which noise components are eliminated.

Figure 15:
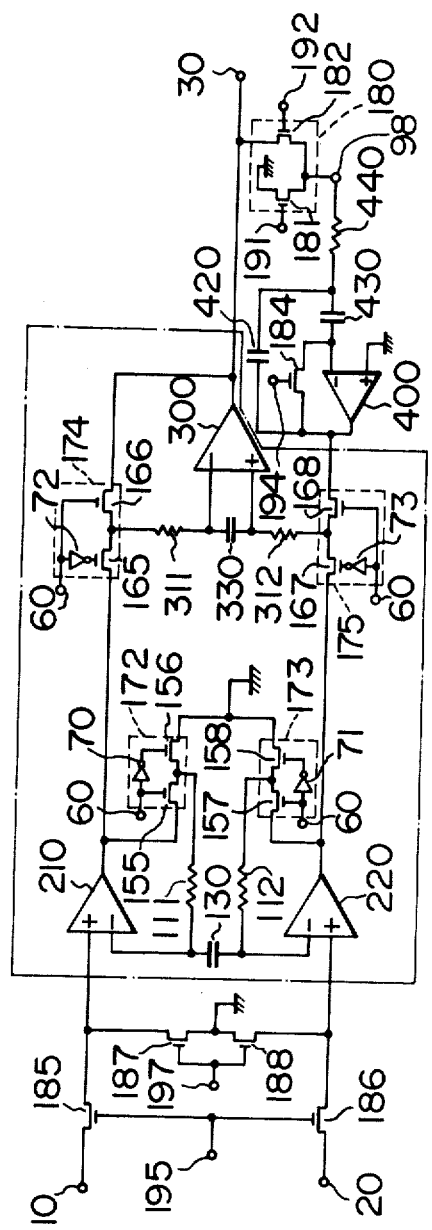
FIG. 15 is a circuit diagram showing a sixth embodiment of the variable gain amplifier according to the invention.

FIG. 15 shows a sixth embodiment of the invention which differs from the one shown in FIG. 13 in that an offset compensating or correcting circuit constituted by a sample and hold circuit is additionally provided. The variable gain amplifier circuits described hereinbefore certainly allow the gain to be set at high accuracy selectively in a wide range and exhibit rapid response. To this end, however, the operational amplifier which constitutes a basic part has to operate with a sufficiently high accuracy. In the applications where presence of an offset voltage of the operational amplifier can not be neglected, the circuit arrangement shown in FIG. 15 is very useful.

More specifically, the circuit shown in FIG. 15 differs from the one shown in FIG. 13 in that an electronic switch, preferably a FET 185 is additionally provided between the input terminal 10 and the non-inverted input terminal of the operational amplifier 210 shown in FIG. 13, while an electronic switch preferably a FET 186 is connected between the input terminal 20 and the non-inverted input terminal of the operational amplifier 220. Further, a series connection of two electronic switches, preferably FET's 187 and 188 is connected between the non-inverted inputs of the operational amplifiers 210 and 220 with a junction between the FET's 187 and 188 being grounded. Additionally, a sample and hold circuit including an operational amplifier 400 is provided between the output terminal of the operational amplifier 300 and the switch circuit 175. In the sample and hold circuit, the output terminal of the operational amplifier 400 is connected to a drain electrode of the FET 168 of the switch circuit 175. The non-inverted input of the operational amplifier 400 is grounded. An electronic switch, preferably a FET 184 is connected between the inverted input and the output terminals of the operational amplifier 400, while the inverted input terminal thereof is connected to the terminal 98 of the switch circuit 180 through a capacitor 430 and a resistor 400. A capacitor 420 is connected between a junction of the capacitor 430 and the resistor 440 and the output terminal of the operational amplifier 400. The switch circuit 180 includes two electronic switches, preferably FET's 181 and 182, wherein the terminal 98 is connected to a source electrode of the FET 181 and to a drain electrode of the FET 182. The FET 181 has a drain electrode grounded, while the FET 182 has a source electrode connected to the output of the operational amplifier 300.

Figure 16:
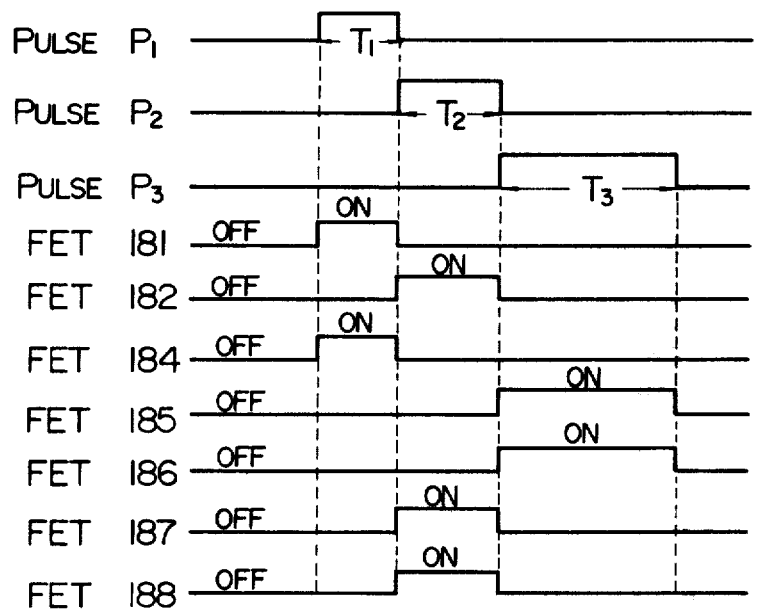
FIG. 16 shows a timing diagram to illustrate signals for controlling operation of the amplifier and on-off modes of switches shown in FIG. 15.

Operation of the differential amplifier circuit shown as enclosed by a chain line is similar to that of the circuit shown in FIG. 13. It should be noted that the individual operational amplifiers 210, 220, 300 and 400 may have offset voltages. Operation of the circuit shown in FIG. 15 includes three operation modes at periods $T_1$, $T_2$ and $T_3$, as is illustrated in FIG. 16. During the period $T_1$, offset of the sample and hold circuit itself is corrected or compensated. During the period $T_2$, offset of the differential amplifier is corrected. During the period $T_3$, amplifying operation of the differential amplifier takes place.

Pulse signals $P_1$, $P_2$ and $P_3$ are produced from a known pulse generator (not shown) and take a high level during the periods $T_1$, $T_2$ and $T_3$, respectively. The pulse signal $P_1$ is applied to the gate terminals 191 and 194 of the FET's 181 and 184, while the pulse signal $P_2$ is applied to the gate terminal 192 of the FET 182 and the common gate terminal 197 of the FET's 187 and 188. The pulse signal $P_3$ is applied to the common gate terminal 195 of the FET's 185 and 186.

During the offset correcting period $T_1$ of the sample and hold circuit, only the FET's 181 and 184 are turned on. Since the inverted input of the operational amplifier 400 is grounded through the capacitor 430 and the resistor 440, presence of an offset voltage at the operational amplifier 400 will cause a current to flow from the output of the operational amplifier 400 to the ground through the FET 184, the capacitor 430, the resistor 440 and the FET 181, as the result of which the capacitor 430 is charged with the offset voltage of the operational amplifier 400, whereby the input to the operational amplifier 400 is balanced. In other words, the offset voltage of the operational amplifier 400 is cancelled to zero in appearance as viewed from the switch circuit 180. Next, during the period $T_2$, the FET's 181 and 184 are turned off, while the FET's 182, 187 and 188 are turned on. Consequently, the input side of the differential amplifier circuit is grounded, resulting in that the output voltage thereof becomes zero due to the negative feedback through the sample and hold circuit. More specifically, presence of the offset voltage at the differential amplifier circuit will cause a current to flow from the output of the operational amplifier 300 through the FET 182, the resistor 440 and the capacitor 420, as the result of which a voltage (offset correcting voltage) for cancelling the output voltage from the differential amplifier circuit to zero is charged in the capacitor 420 to thereby balance the voltage at the output terminal 30 at zero. During the period $T_3$, the FET's 182, 187 and 188 are turned off, while the FET's 185 and 186 are turned on, whereby the input voltage signal is allowed to be applied to the differential amplifier circuit to be amplified. Thus, the differential amplifier circuit operates as a variable gain amplifier which produces an output voltage defined accurately by the input signal voltage and the duty factor $\alpha$ of the switch circuits 172, 173, 174 and 175. When the offset voltage of the operational amplifier 400 with reference to the potential at the output terminal 30 of the differential amplifier circuit is sufficiently low, the operation during the period $T_1$ may be omitted. In this manner, the variable gain amplifier according to the invention is capable of effecting amplification with a gain determined at high accuracy through control of the duty cycle of the control pulse signal, even when the operational amplifier has an offset voltage. Further, the variable gain amplifier according to the invention can be employed with various modifications as described above to give a great flexibility in use.

As will be appreciated from the foregoing description, the present invention has provided the varaible gain amplifiers which assure high accuracy in amplification and exhibit a rapid resonse without resorting to the use of high precision circuit elements.

We claim:

1. In a variable gain amplifier apparatus having means for receiving an input signal, at least one amplifier means including an amplifier for amplifying the received input signal, switch means controlled in on-off operation thereof with a given duty factor in response to an externally applied control signal, and a smoothing filter connected to said switch means, wherein the amplification factor of said amplifier means is varied by varying the duty factor of said switch means, the improvement comprising a negative feedback loop of said amplifier means is composed of said switch means and said smoothing filter in series and said smoothing filter having a time constant which is greater than the on-off period of said switch means.

2. A variable gain amplifier apparatus according to claim 1, wherein said switch means includes a pair of FET's and an inverter gate, and means for connecting said FET's in series so as to be controlled in opposite phase relation through said inverter gate by said externally applied control signal.

3. A variable gain amplifier apparatus according to claim 1, wherein said switch means is connected to the output of said amplifier and to a terminal to which said control signal is externally applied, and includes means for applying the output voltage from said amplifier and said external control signal alternately to said smoothing filter with a given duty cycle.

4. A variable gain amplifier apparatus according to claim 3, wherein said amplifier includes a pair of inputs and said input signal receiving means is connected to one input of said amplifier, said smoothing filter including a resistor and a capacitor which is connected to alternately receive the output from said amplifier and said external control signal with said given duty cycle, the output of said capacitor being coupled to the other input of said amplifier.

5. A variable gain amplifier apparatus according to claim 1 or 2, wherein said amplifier is constituted by an inverted amplifier.

6. A variable gain amplifier apparatus according to claim 5, wherein said amplifier includes a pair of inputs and said smoothing filter means is inserted at least in part between one and the other input of said amplifier.

7. A variable gain amplifier apparatus according to claim 6, wherein said switch means is connected to said input signal receiving means and to the output side of said amplifier, whereby said input signal and the output signal from said amplifier are alternately supplied to said filter with a given duty cycle.

8. A variable gain amplifier apparatus according to claim 7, wherein said smoothing filter includes a capacitor and a resistor, said capacitor being connected between one and the other inputs of said amplifier and connected to said switch means through said resistor.

9. A variable gain amplifier according to claim 1 or 2, wherein said amplifier means is connected to means for applying differential input signals to said amplifier means.

10. A variable gain amplifier apparatus according to claim 9, wherein said differential input signal applying means includes a first input terminal for receiving a first input signal and a second input terminal for receiving a second input signal, including means for changing over said switch means alternately between first and second states with said given duty cycle, wherein a difference signal between the signals applied to said first and second input terminals is applied to said filter in said first state, while in said second state the output from said amplifier is applied to said filter.

11. A variable gain amplifier apparatus according to claim 10, wherein said switch means includes a first switch and a second switch, said first switch being connected to said first input terminal and the output side of said amplifier, while said second switch is connected to said second input terminal and a terminal to which a predetermined constant potential is externally applied, said first switch supplying the first input signal to one end of said filter in said first state and supplying the output signal from said amplifier to said one end of said filter in said second state, while said second switch supplies the second input signal to the other end of said filter in said first state and supplies said externally applied potential to said other end of said filter in said second state.

12. A variable gain amplifier apparatus according to claim 11, wherein said filter includes a capacitor connected between the input terminals of said amplifier, a resistor connected between one end of said capacitor and said first switch, and a resistor connected between the other end of said capacitor and said second switch.

13. A variable gain amplifier apparatus according to claim 1 or 2, wherein said amplifier means is provided with differential input means and differential output means.

14. A variable gain amplifier apparatus according to claim 13, wherein said input signal receiving means includes a first input terminal for receiving a first input signal and a second input terminal for receiving a second input signal, said amplifier means including a first amplifier for receiving said first input signal at one input terminal thereof and a second amplifier for receiving said second input signal at one input terminal thereof, said switch means being connected to the output terminals of said first and second amplifiers and to a terminal to which a predetermined potential is externally applied, said switch means being changed over with said given duty cycle alternately between one and the other states and adapted to apply a difference voltage between the outputs of said first and second amplifiers to said filter in said one state, while in said other state of said switch means said externally applied potential is applied to said filter, whereby a difference output signal between the output signal from said first and second amplifiers is produced.

15. A variable gain amplifier apparatus according to claim 14, wherein said switch means includes a first switch and a second switch, said first switch being connected to the output terminal of said first amplifier and to said external potential input terminal and being adapted to apply the output signal from said first amplifier to one end of said filter in one state while in the other state of said first switch said externally applied potential is applied to said one end of said filter, said second switch being connected to the output terminal of said second amplifier and to said external potential input terminal and adapted to apply the output signal of said second amplifier to the other end of said filter in one state, while in the other state of said second switch said externally applied potential is applied to said other end of said filter.

16. A variable gain amplifier apparatus according to claim 15, wherein said filter includes a capacitor connected between the other input terminals of said first and second amplifiers, respectively, a resistor connected to the other input terminal of said first amplifier and to said first switch, and a resistor connected to the other input terminal of said second amplifier and to said second switch.

17. A variable gain amplifier apparatus according to claim 1 or 2, wherein said amplifier means includes a differential amplifier of the dynamic bridge type having a high input impedance.

18. A variable gain amplifier apparatus according to claim 17, wherein said input signal receiving means includes a first terminal for receiving a first input signal and a second input terminal for receiving a second input signal,
   said amplifier means including a first amplifier for receiving said first input signal at one input terminal thereof, and a second amplifier for receiving said second input signal at one input terminal thereof, and a third amplifier,
   said filter including a first filter circuit having output coupled between the other input terminals of said first and second amplifiers, respectively, and a second filter circuit having output coupled between input terminals of said third amplifier,
   said switch means including first and second switch circuits each adapted to be changed over between one and the other states with a given duty cycle,
   said first switch circuit being connected to the output terminals of said first and second amplifiers and to a terminal to which a predetermined potential is externally applied, said first switch circuit being adapted to apply a difference voltage between the output voltages of said first and second amplifiers to said first filter circuit in one state, while in the other state of said first switch circuit said externally applied potential is supplied to said first filter circuit, and
   said second switch circuit being adapted to apply a difference voltage between the output voltages of said first and second amplifiers to said second filter circuit in one state, while in the other state of said second switch circuit, the output voltage of said third amplifier is applied to said second filter circuit.

19. A variable gain amplifier apparatus according to claim 1, 4, 6, 7, 8, 10, 11, 12, 14, 15, 16 or 18, further including offset correcting means for controlling the output voltage of said amplifier means to zero in the quiescent state of said amplifier means.

20. A variable gain amplifier apparatus according to claim 19, wherein said offset correcting means includes a series connection of a switch circuit and an integrator connected between the input and output sides of said amplifier means.

21. A variable gain amplifier apparatus according to claim 19, wherein said offset correcting means comprises a sample and hold circuit connected between the input and the output sides of said amplifier means and including an operational amplifier, a pair of electronic switches, a pair of capacitors and a resistor.

22. A variable gain amplifier apparatus comprising an operational amplifier having a plus input terminal to which an input signal is to be applied, a minus input terminal and an output terminal; and a negative feedback circuit connected between the output terminal and the minus input terminal of said operational amplifier, including a smoothing filter and switching means connected in series with said smoothing filter and having a control terminal connected to receive an externally applied control signal having a controllable duty cycle for controlling the gain of said operational amplifier according to said duty cycle.

23. A variable gain amplifier apparatus comprising an operational amplifier having a plus input terminal to which an input signal is to be applied, a minus input terminal and an output terminal; and a negative feedback circuit connected between the output terminal and the minus input terminal of said operational amplifier, including a smoothing filter and switching means connected in series with said smoothing filter and responsive to an applied control signal having a selected duty cycle for controlling the gain of said operational amplifier according to said duty cycle, wherein said switching means comprises first and second transistors connected in series between the output terminal of said operational amplifier and ground, and means for rendering said first and second transistors alternately conductive in response to said applied control signal and in accordance with said selected duty cycle, said smoothing filter being connected between the point of connection of said first and second transistors and the minus input terminal of said operational amplifier.

24. A variable gain amplifier apparatus according to claim 23, wherein said smoothing filter comprises a resistor and a capacitor connected in series between the point of connection of said first and second transistors and ground, the point of connection of said resistor and capacitor being connected to the minus input terminal of said operational amplifier.

25. A variable gain amplifier apparatus according to claim 22, further including pulse generator means connected to said control terminal of said switching means for supplying said control signal thereto.

26. A variable gain amplifier apparatus according to claim 22, wherein said smoothing filter has a time constant which is longer than the on-off period of said switching means on which said duty cycle is based.

27. A variable gain amplifier apparatus comprising an amplifier having a minus input terminal to which an input signal is to be applied and an output terminal; a smoothing filter connected to the minus input terminal of said amplifier; and switching means connected to said smoothing filter and responsive to an applied control signal having a selected duty cycle for alternately connecting said input signal and the output terminal of said amplifier to said smoothing filter to control the gain of said amplifier according to said duty cycle.

28. A variable gain amplifier apparatus according to claim 27, wherein said switching means includes first and second transistors connected in series between the output terminal of said amplifier and an input terminal to which said input signal is to be applied, and means for rendering said first and second transistors alternately conductive in response to said applied control signal and in accordance with said selected duty cycle, said smoothing filter being connected to the point of connection of said first and second transistors.

29. A variable gain amplifier apparatus according to claim 28, wherein said amplifier is an inverted amplifier, and said smoothing filter includes a resistor and a capacitor connected in series between the point of connection of said first and second transistors, and ground, the point of connection of said resistor and capacitor being connected to the input terminal of said inverted amplifier.

30. A variable gain amplifier apparatus according to claim 28, wherein said amplifier is an operational amplifier having a plus input terminal as well as said minus input terminal, and said smoothing filter includes a resistor and a capacitor connected in series to the point of connection of said first and second transistors and the capacitor in said smoothing filter being connected between said plus input terminal and said minus input terminal of said operational amplifier.

* * * * *